(12) United States Patent
Bruckner et al.

(10) Patent No.: US 11,160,198 B2
(45) Date of Patent: Oct. 26, 2021

(54) POWER ELECTRIC DEVICE FOR A VEHICLE

(71) Applicant: Mahle International GmbH, Stuttgart (DE)

(72) Inventors: Jens Bruckner, Waiblingen (DE); Jose Antonio Castillo, San Antonio de Benageber (ES); Francisco Gonzalez Espin, Elche (ES); Manuel Klingler, Marbach a.N. (DE); Alfredo Perez, Motila des Palancar (ES); Christoph Walter, Stuttgart (DE)

(73) Assignee: Mahle International GmbH

( * ) Notice: Subject to any disclaimer, the term of this patent is extended or adjusted under 35 U.S.C. 154(b) by 0 days.

(21) Appl. No.: 16/663,331

(22) Filed: Oct. 24, 2019

(65) Prior Publication Data

US 2020/0137930 A1    Apr. 30, 2020

(30) Foreign Application Priority Data

Oct. 26, 2018    (DE) .......................... 102018218388.0

(51) Int. Cl.
*H05K 7/20*    (2006.01)
*H01L 23/473*    (2006.01)
(Continued)

(52) U.S. Cl.
CPC ....... *H05K 7/20927* (2013.01); *B60H 1/2221* (2013.01); *F28F 3/02* (2013.01);
(Continued)

(58) Field of Classification Search
CPC . H01L 23/473; H01L 23/427; H05K 7/20927; H05K 7/20772; H05K 7/20809; H05K 7/20336; H05K 7/20781; H05K 7/20936; H05K 7/20745; H05K 7/2079; H05K 7/20254; H05K 7/20272; H05K 7/20872; H05K 7/20145; H05K 7/2029;
(Continued)

(56) References Cited

U.S. PATENT DOCUMENTS

2005/0121173 A1* 6/2005 Inagaki ................ H01L 25/074
165/80.3
2006/0243422 A1* 11/2006 Sakai .................... H01L 23/473
165/80.4
(Continued)

FOREIGN PATENT DOCUMENTS

DE         19542125 A1    5/1996
DE    102011003296 A1    8/2012
DE    102017130354 A1    6/2019

OTHER PUBLICATIONS

German Search Report dated Sep. 20, 2019 related to corresponding German Patent Application No. 10 2018 218 388.0.

*Primary Examiner* — Adam B Dravininkas
(74) *Attorney, Agent, or Firm* — Fishman Stewart PLLC

(57) ABSTRACT

The present disclosure relates to a power electronic device for a vehicle. The power electronic device includes at least one intermediate unit having at least one fluid duct system fluidically connected to a fluid inlet and a fluid outlet, at least one power electronic unit arranged at least at a surface of the at least one intermediate unit, and at least one heating device arranged at least at a surface of the at least one intermediate unit.

20 Claims, 5 Drawing Sheets

(51) Int. Cl.
*F28F 3/02* (2006.01)
*B60H 1/22* (2006.01)

(52) U.S. Cl.
CPC ......... *H01L 23/473* (2013.01); *H05K 7/2029* (2013.01); *H05K 7/20145* (2013.01); *H05K 7/20872* (2013.01)

(58) Field of Classification Search
CPC ...... G06F 1/20; G06F 2200/201; G06F 1/206; G06F 1/203; H02M 7/003; H02M 7/5387; H02M 2001/327; B60H 1/2221; B60H 1/034; F28F 3/02
See application file for complete search history.

(56) References Cited

U.S. PATENT DOCUMENTS

| | | | |
|---|---|---|---|
| 2008/0302505 A1* | 12/2008 | Kato | F25B 25/005 |
| | | | 165/61 |
| 2010/0321889 A1* | 12/2010 | Yoshino | H05K 7/20927 |
| | | | 361/702 |
| 2010/0326750 A1* | 12/2010 | Murakami | B60L 58/34 |
| | | | 180/65.31 |
| 2014/0027444 A1 | 1/2014 | Kohl et al. | |
| 2015/0109731 A1* | 4/2015 | Umematsu | H05K 7/20727 |
| | | | 361/691 |
| 2016/0073556 A1* | 3/2016 | Nakasaka | H01L 23/473 |
| | | | 361/699 |
| 2017/0105320 A1* | 4/2017 | Park | H05K 7/20909 |

* cited by examiner

POWER ELECTRIC DEVICE FOR A VEHICLE

CROSS-REFERENCE TO RELATED APPLICATION

This application claims priority to German Application No. DE 10 2018 218 388.0 filed on Oct. 26, 2018, the contents of which are hereby incorporated by reference in its entirety.

TECHNICAL FIELD

The present invention relates to a power electronic device for a vehicle.

BACKGROUND

Such power electronic devices are used in particular in completely electrically operated vehicles and/or in hybrid vehicles to convert electrical energy between an electrical energy storage device of the vehicle and an electrical consumer of the vehicle.

In addition to power electronic devices, separate heating devices are used in electrically operated vehicles and/or in hybrid vehicles, which convert electrical energy into heat energy in order to attain a heating of certain subregions of the vehicle, because, compared to conventional vehicles, no or at least temporarily no waste heat energy from an internal combustion engine is available.

SUMMARY

The present invention is based on the object of finding a more cost-efficient as well as more compact design of a power electronic device and of a heating device.

This problem is solved according to the invention by means of the subject matters of the independent claim(s). Advantageous embodiments are subject matter of the dependent claims.

The present invention is based on the general idea of using the waste heat energy of the power electronic device to heat certain subregions of the vehicle.

The power electronic device according to the invention for a vehicle comprises at least one intermediate unit, which has at least one fluid duct system, which is connected to a fluid inlet and a fluid outlet. The fluid inlet and the fluid outlet can be arranged outside of a housing of the power electronic device.

The intermediate unit can be made of a heat conductive material, which has at least a heat conductivity, which is higher than the heat conductivity of air. This heat conductive material can be, for example, a metallic material. The intermediate unit can be configured as essentially plate-shaped element. This plate-shaped element can have at least six surface sides, wherein two of these surface sides can be configured as main surface sides. The sum of the areas of the main surface sides can comprise at least half of the total surface of the plate-shaped element. The intermediate unit can be configured of at least two half shells, which are soldered together. It can be provided that the intermediate unit can be configured as stacked heat exchanger.

The power electronic device according to the invention further has at least one power electronic unit, which is arranged at least at a surface of the intermediate unit. The power electronic device can have an electrical input terminal and an electrical output terminal, wherein the electrical input terminal can be connected to the power electronic unit in an electrically conductive manner, and the electrical output terminal can be connected to the power electronic unit in an electrically conductive manner.

Electrical energy, which is converted by means of the power electronic unit and which can be dissipated via the electrical output terminal, can be supplied to the power electronic unit via the electrical input terminal.

The power electronic unit can have a rectifier unit, which is configured to convert alternating voltage into direct voltage or alternating current into direct current, respectively. The power electronic unit can further have a converter unit, which is configured to convert direct voltage into alternating voltage or direct current into alternating current, respectively. The power electronic unit can further have direct current control unit, which is configured for converting a direct voltage into a higher or lower direct voltage. The power electronic unit can further have an alternating current control unit and/or frequency inverter unit, which is configured to convert the frequency and/or the amplitude of an alternating current. The power electronic unit can also comprise a charging unit, which can be coupled to an external electrical energy source, which is present outside of the vehicle, in order to at least temporarily supply electrical energy from the external electrical energy source to the electrical energy storage device of the vehicle.

The power electronic device according to the invention has at least one heating device, which is arranged at least at a surface of the intermediate unit. The heating device can have a resistance heating element and/or a thick film heating element, in order to convert electrical energy into heat energy and so as to thus provide a desired heat capacity. The heating device can also have a PTC element (PTC=Positive Temperature Coefficient), which has a temperature-dependent resistance comprising a positive temperature coefficient, wherein a non-linear connection exists between the electrical resistance and the temperature of the PTC element. If a limit temperature is exceeded, the resistance of the PTC element increases non-linearly as the temperature increases.

The heating device can be connected to the power electronic unit in an electrically conductive manner and can be supplied via the latter with a suitable electrical power or electrical energy, respectively.

The intermediate unit can be fluidically connected to a fluid circuit of the vehicle via the fluid inlet and the fluid outlet, so that a fluid, in particular a coolant and/or refrigerant, flows through the intermediate unit. When flowing through the intermediate unit, the fluid can be heated via the waste heat of the power electronic unit and/or via the heat capacity of the heating element.

The power electronic device according to the invention thus has an integrated heating device, so that the space requirement inside the vehicle is reduced, because no installation space is required for a separate heating device. The production costs are further reduced significantly, because the power electronic unit and the heating device share components of the power electronic device, which would otherwise be present at least in duplicate. This includes, for example, at least one housing of the power electronic device and/or the electrical input terminal and the electrical output terminal.

The power electronic device according to the invention can be used in a method for heating a subregion of a vehicle. The power electronic device can thereby be operated in a first operating mode, in which the power electronic unit is turned on and the heating device is turned off. The power electronic device can be operated in a second operating mode, in which the power electronic unit is turned off and the heating device is turned on. The power electronic device can be operated in a third operating mode, in which the power electronic unit and the heating device are turned on.

It can be provided that a plurality of power electronic units, which are spaced apart from one another, are arranged at at least one surface of the intermediate unit. It can be provided that a plurality of heating devices, which are spaced apart from one another, are arranged at at least one surface of the intermediate unit.

In the case of a further advantageous embodiment of the solution according to the invention, it is provided that the heating device is arranged downstream from the power electronic unit with respect to a fluid flow through the fluid duct system. A fluid flow can thereby be understood to be a flow direction of a fluid along the fluid duct system between fluid inlet and fluid outlet. It can be prevented thereby that the heat energy provided by the heating device leads to a heating of the power electronic unit.

In the case of an advantageous further development of the solution according to the invention, it is provided that the heating device and the power electronic unit are arranged on different surface sides of the intermediate unit. It can be provided that the power electronic unit is arranged on a first main surface side of the intermediate unit, and the heating device on a second main surface side of the intermediate unit. It can be provided that these two main surface sides are arranged so as to be spaced apart from one another and essentially parallel to one another.

In the case of a further advantageous embodiment of the solution according to the invention, it is provided that the intermediate unit is configured at least by a first intermediate element and at least by a second intermediate element. The first intermediate element thereby has at least a first fluid duct, wherein the second intermediate element has at least a second fluid duct. The first fluid duct and the second fluid duct form the fluid duct system.

It can be provided that the first intermediate element is configured of at least two half shells, which are soldered together. It can be provided that the first intermediate element is configured as stacked heat exchanger. It can further be provided that the second intermediate element is configured of at least to half shells, which are soldered together. It can be provided that the second intermediate element is configured as stacked heat exchanger.

It is also conceivable that the first intermediate element comprises a first half shell and that the second intermediate element comprises a second half shell, wherein an intermediate plate can be provided between the first half shell and the second half shell. The first half shell, the intermediate plate, and the second half shell can be soldered to one another thereby.

In the case of an advantageous further development of the solution according to the invention, it is provided that the first intermediate element has a first fluid inlet and a first fluid outlet, which are fluidically connected to the first fluid duct. It is further provided that the second intermediate element has a second fluid inlet and a second fluid outlet, which are fluidically connected to the second fluid duct. This provides for a fluidic attachment of the intermediate unit to at least two fluid circuits of the vehicle. It can be provided, for example, that no fluidic connection is present between the first fluid duct and the second fluid duct. It can be provided that the first intermediate element is configured essentially for cooling the power electronic unit. It can be provided that the second intermediate element is configured essentially for heating a fluid of an air conditioning circuit (HVAC unit) and/or of a battery cooling circuit of a vehicle.

In the case of a further advantageous embodiment of the solution according to the invention, it is provided that the first fluid duct and the second fluid duct are fluidically connected to one another, in order to provide for a flow-through of the first intermediate element and of the second intermediate element.

In the case of an advantageous further development of the solution according to the invention, it is provided that the first intermediate element is arranged at least partially at the second intermediate element, in order to attain a setup of the power electronic device, which is as compact as possible.

In the case of a further advantageous embodiment of the solution according to the invention, it is provided that the first intermediate element and the second intermediate element are at least partially connected to one another by means of a substance-to-substance bond, in order to increase the mechanical resistance of the power electronic device. This substance-to-substance bond can take place, for example, by means of soldering and/or by means of adhesion.

In the case of an advantageous further development of the solution according to the invention, it is provided that the first intermediate element and the second intermediate element are at least partially connected to one another via an additional layer. Depending on the design of the power electronic device compared to the material of the first intermediate element and of the second intermediate element, the additional layer can be configured to be either thermally conductive or thermally insulating In the case of a further advantageous embodiment of the solution according to the invention, it is provided that the first fluid duct is configured to be essentially straight, wherein the second fluid duct is configured to be essentially straight. It can be provided that the flow direction in the first fluid duct is configured to be opposite to the flow direction in the second fluid chamber and/or second fluid duct.

In the case of an advantageous further development of the solution according to the invention, it is provided that the first fluid duct is configured to be essentially U-shaped, wherein the second fluid duct is configured to be essentially U-shaped. It can be provided that the flow direction in the first fluid duct is configured to be opposite to the flow direction in the second fluid duct. It can be provided that the flow direction in the first fluid duct corresponds to the flow direction in the second fluid duct.

In the case of a further advantageous embodiment of the solution according to the invention, it is provided that the heating device is arranged between the first intermediate element and the second intermediate element, in order to maximize the transfer of the heat energy to the fluid. The heating device can thereby in particular comprise a PTC element. It can also be provided that the heating device and/or the fluid duct system and/or the intermediate elements are configured in such a way that an asymmetrical distribution of the heating capacity to the first intermediate element and the second intermediate element forms. It can be provided thereby that the power electronic unit is arranged at the intermediate element, to which a lower heating capacity is transferred.

It can be provided, for example, that one-third of the heating capacity is transferred to the first intermediate element, and that two-thirds of the heating capacity are transferred to the second intermediate element, wherein in this case, the power electronic unit can be arranged at a surface of the first intermediate element. It is also conceivable that an asymmetrical distribution of the heating capacity is attained by means of an adaptation of the respective fluid quantity per time unit, which flows through the first intermediate element or the second intermediate element, respectively.

In the case of an advantageous further development of the solution according to the invention, it is provided that a first housing section and a second housing section are provided, wherein the power electronic unit is arranged between the intermediate unit and the first housing section, wherein the heating device is arranged between the intermediate unit and the second housing section. The fluid inlet and the fluid outlet of the intermediate unit can be arranged outside of the first housing section and of the second housing section of the power electronic device.

The first housing section and the second housing section can be made, for example, of a metallic material and/or of a plastic, wherein a combination of a metallic material in connection with a plastic is conceivable as well.

In the case of a further advantageous embodiment of the solution according to the invention, it is provided that the fluid duct system has turbulence inserts. The heat absorption or the heat dissipation, respectively, of the fluid when flowing through the intermediate unit can be set via the turbulence inserts.

In the case of an advantageous further development of the solution according to the invention, it is provided that the power electronic unit and/or the heating device are attached to a surface of the intermediate unit by means of a substance-to-substance bond, in order to establish a thermally advantageous contacting. The substance-to-substance bond can take place, for example, by means of adhesion and/or by means of soldering.

In the case of an advantageous further development of the solution according to the invention, it is provided that the intermediate unit forms a housing wall, in particular a housing bottom, of a housing and/or of a housing section of the power electronic device. It can be provided, for example, that the intermediate unit is releasably connected to the housing and/or housing section via connecting elements.

In the case of a further advantageous embodiment of the solution according to the invention, it is provided that the fluid duct system is configured to be essentially straight at least in some sections and/or to be essentially U-shaped at least in some sections.

In the case of an advantageous further development of the solution according to the invention, it is provided that only one intermediate unit is provided.

In the case of a further advantageous embodiment of the solution according to the invention, it is provided that the power electronic unit and the heating device are arranged in series at the intermediate unit with respect to a fluid flow through the fluid duct system. In series is to be understood in such a way that the power electronic unit and the heating device are arranged spaced apart from one another on the intermediate unit along the fluid flow. It can be provided that the power electronic unit and the heating device are arranged on the same surface side of the intermediate unit.

In the case of an advantageous further development of the solution according to the invention, it is provided that at least two turbulence inserts are provided, which are configured differently. It can be provided that the turbulence inserts are varied along the fluid flow or the flow direction, respectively, in such a way that different heat coupling degrees and/or heat decoupling degrees are attained.

In the case of an advantageous further development of the solution according to the invention, it is provided that the intermediate unit has at least one intermediate element and/or cooling element, which is reshaped and soldered together. Such an intermediate element and/or cooling element can be made of individual or separate reshaped sheets, respectively, which are soldered together. Such an intermediate element and/or cooling element can configure a plate heat exchanger, which is constructed and/or configured of individual sheets.

It can be provided that the first intermediate element forms an intermediate element and/or cooling element, which is reshaped and soldered together. Such an intermediate element and/or cooling element can be made of individual or separate reshaped sheets, respectively, which are soldered together. Such an intermediate element and/or cooling element can configure a plate heat exchanger, which is constructed and/or configured of individual sheets.

It can be provided that the second intermediate element forms an intermediate element and/or cooling element, which is reshaped and soldered together. Such an intermediate element and/or cooling element can be made of individual or separate reshaped sheets, respectively, which are soldered together. Such an intermediate element and/or cooling element can configure a plate heat exchanger, which is constructed and/or configured of individual sheets.

The first intermediate element can be configured separately with respect to the second intermediate element.

Further important features and advantages of the invention follow from the subclaims, from the drawings, and from the corresponding figure description on the basis of the drawings.

It goes without saying that the above-mentioned features and the features, which will be described below, cannot only be used in the respective specified combination, but also in other combinations or alone, without leaving the scope of the present invention.

Preferred exemplary embodiments of the invention are illustrated in the drawings and will be described in more detail in the following description, whereby identical reference numerals refer to identical or similar or functionally identical components.

BRIEF DESCRIPTION OF THE DRAWINGS

In each case schematically.

DETAILED DESCRIPTION

Figure 1:
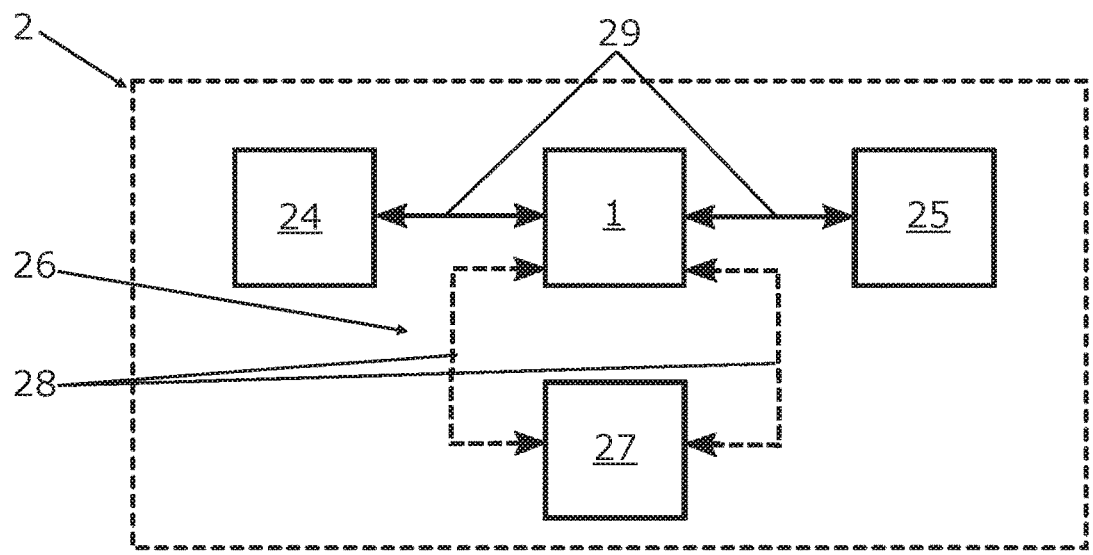
FIG. 1 shoes a simplified schematic diagram of a vehicle comprising a power electronic device according to the invention.

A simplified schematic diagram of a vehicle 2 comprising a power electronic device 1 according to the invention is illustrated in FIG. 1, wherein the power electronic device 1 is connected to an energy storage device 24 of the vehicle 2 via electrical lines 29, and to an electrical consumer 25 in an electrically conductive manner. The energy storage device 24 can be, for example, a battery unit of the vehicle 2, which provides a predefined direct voltage or a predefined direct current, respectively. The electrical consumer 25 can be, for example, an electric motor unit, which requires an alternating voltage or an alternating current, respectively, for the proper operation. The power electronic device 1 converts the electrical energy, which is provided by the energy storage device 24, in the manner as required by the electrical consumer 25.

The power electronic device 1 is fluidically connected to a fluid circuit 26 of the vehicle 2, wherein the fluid circuit has a plurality of fluid lines 28, which fluidically connect a subregion 27 of the vehicle 2 to the power electronic device 1. The subregion 27 can comprise, for example, a vehicle interior and/or a battery unit. The heating capacity provided by the power electronic device 1 can be transported to the subregion 27 via the fluid circuit 26. The fluid circuit 26 can have a non-illustrated fluid conveying device.

Figure 2:
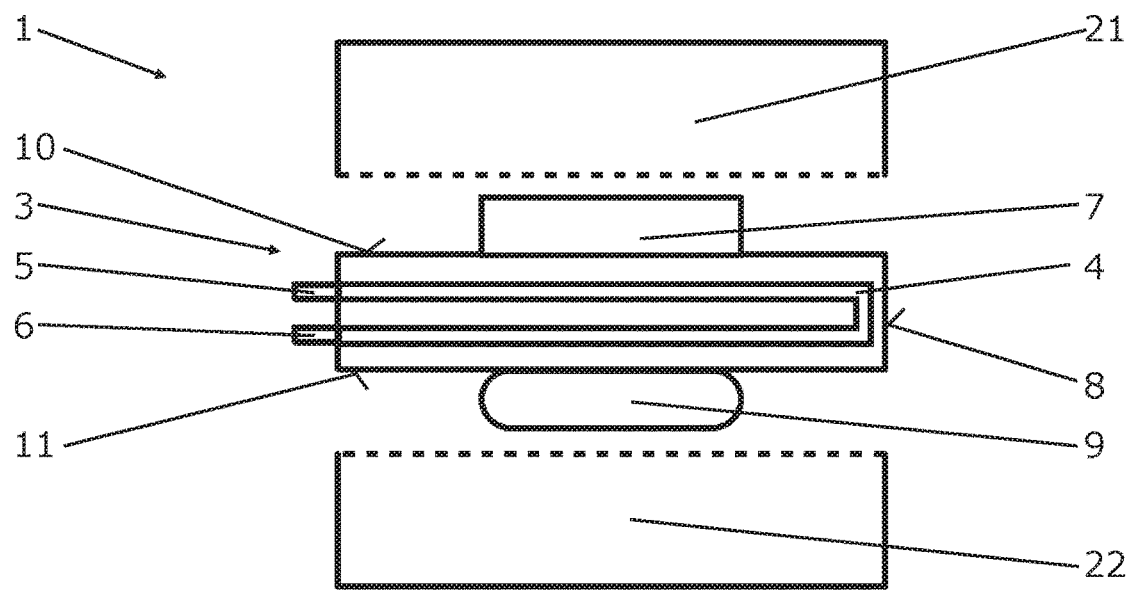
FIG. 2 shows a simplified schematic diagram of a power electronic device according to the invention

A simplified schematic diagram of a power electronic device 1 according to the invention is shown in FIG. 2, wherein the power electronic device 1 is shown in a state, before its components are assembled. The power electronic device 1 has a first housing section 21 and a second housing section 22, between which an intermediate unit 3 is arranged. In the assembled state of the power electronic device 1, which is illustrated in FIG. 3, for example, a subregion of the first housing section 21 abuts on the intermediate unit 3, wherein a subregion of the second housing section 22 abuts on the intermediate unit 3.

The intermediate unit 3 has a fluid duct system 4, which is fluidically connected to a fluid inlet 5 and a fluid outlet 6. The fluid duct system 4 is arranged inside the intermediate unit 3. The intermediate unit 3 has a total surface 8, which comprises a plurality of surface sides, wherein a first surface side 10 and a second surface side 11 are located opposite one another.

A power electronic unit 7 is arranged on the first surface side 10 of the intermediate unit 3. A heating device 9 is arranged on the second surface side 11 of the intermediate unit 3. The power electronic unit 7 is supplied with electrical energy via non-illustrated lines and converts this electrical energy in predetermined manner, wherein electrical energy is partially converted into heat. This heat energy can be absorbed via a fluid, which flows through the fluid duct system. This absorbed heat energy can be transported to a subregion 27 of the vehicle 2, in order to heat the subregion 27. If the heat energy dissipated by the power electronic unit 7 is not sufficient, additional heat energy can be supplied to the fluid via the heating device 9.

Figure 3:
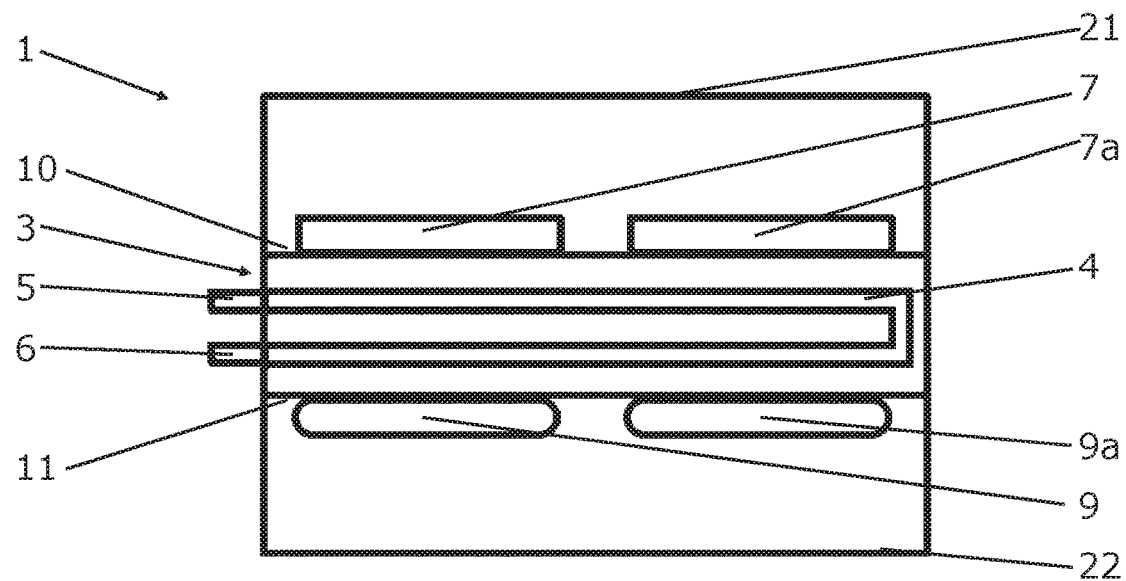
FIG. 3 shows a simplified schematic diagram of a further embodiment of a power electronic device according to the invention.

A simplified schematic diagram of a further embodiment of a power electronic device 1 according to the invention is illustrated in FIG. 3, which has a first housing section 21 and a second housing section 22, between which an intermediate unit 3 is arranged. A subregion of the first housing section 21 thereby abuts on the intermediate unit 3, wherein a subregion of the second housing section 22 abuts on the intermediate unit 3.

The intermediate unit 3 has a fluid duct system 4, which is fluidically connected to a fluid inlet 5 and a fluid outlet 6. The fluid duct system 4 is arranged inside the intermediate unit 3. The intermediate unit 3 has a plurality of surface sides, wherein a first surface side 10 and a second surface side 11 are located opposite one another.

A first power electronic unit 7 and a second power electronic unit 7a are arranged on the first surface side 10 of the intermediate unit 3. A first heating device 9 and a second heating device 9a are arranged on the second surface side 11 of the intermediate unit 3. The first power electronic unit 7 and the second power electronic unit 7a can be arranged spaced apart form one another. The first heating device 9 and the second heating device 9a can be arranged spaced apart from one another.

Figure 4:
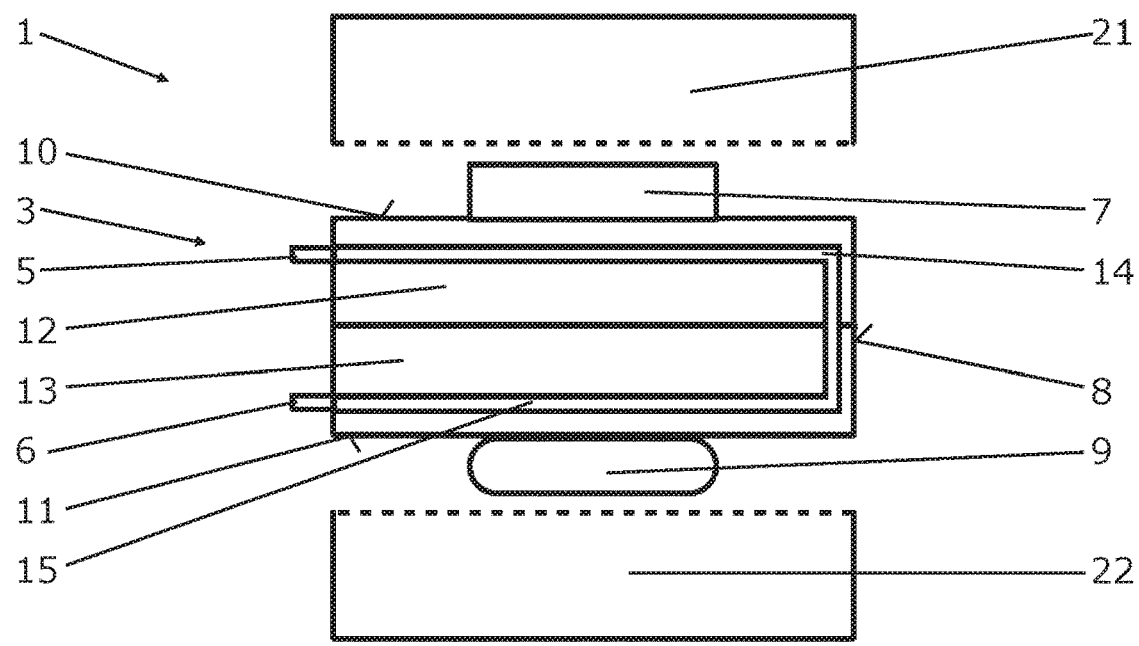
FIG. 4 shows a simplified schematic diagram of a power electronic device according to the invention comprising two intermediate elements.

A simplified schematic diagram of a power electronic device 1 according to the invention is shown in FIG. 4, wherein the intermediate unit 3 is configured by a first intermediate element 12 and a second intermediate element 13.

The power electronic device 1 has a first housing section 21 and a second housing section 22, between which the intermediate unit 3 is arranged. In an assembled state of the power electronic device 1, which is not illustrated here, a subregion of the first housing section 21 abuts on the first intermediate element 12, wherein a subregion of the second housing section 22 abuts on the second intermediate element 13.

The surfaces of the first intermediate element 12 and of the second intermediate element 13 form the total surface 8 of the intermediate unit 3, wherein each intermediate element has a plurality of surface sides. A surface side of the first intermediate element 12 forms the first surface side 10 of the intermediate unit 3, and a second surface side of the second intermediate element 13 forms the second surface side 11 of the intermediate unit 3.

The first intermediate element 12 has a first fluid duct 14, which is fluidically connected to the fluid inlet 5. The second intermediate element 13 has a second fluid duct 15, which is fluidically connected to the fluid outlet 6. The first fluid duct 14 and the second fluid duct 15 form the fluid duct system 4 of the intermediate unit 3. It can be provided thereby that the first fluid duct 14 and the second fluid duct 15 are fluidically connected to one another.

Figure 5:
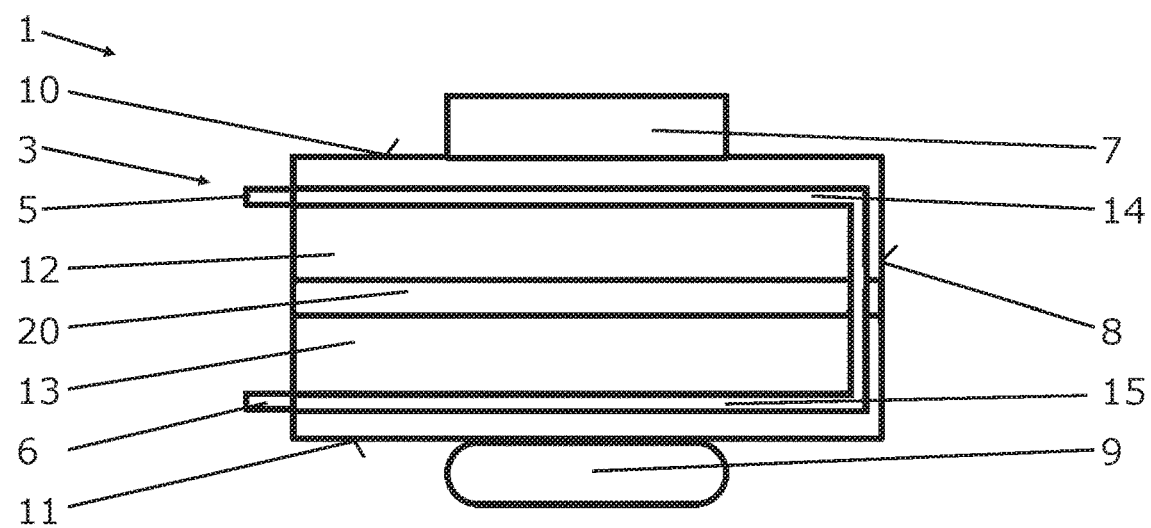
FIG. 5 shows a simplified schematic diagram of a power electronic device according to the invention comprising two intermediate elements and one additional layer.

A simplified schematic diagram of a power electronic device 1 according to the invention is shown in FIG. 5, wherein the first housing section 21 and the second housing section 22 are not illustrated. Compared to FIG. 4, an additional layer 20, which can be configured, for example, so as to be thermally insulating, is arranged between the first intermediate element 12 and the second intermediate element 13.

Figure 6:
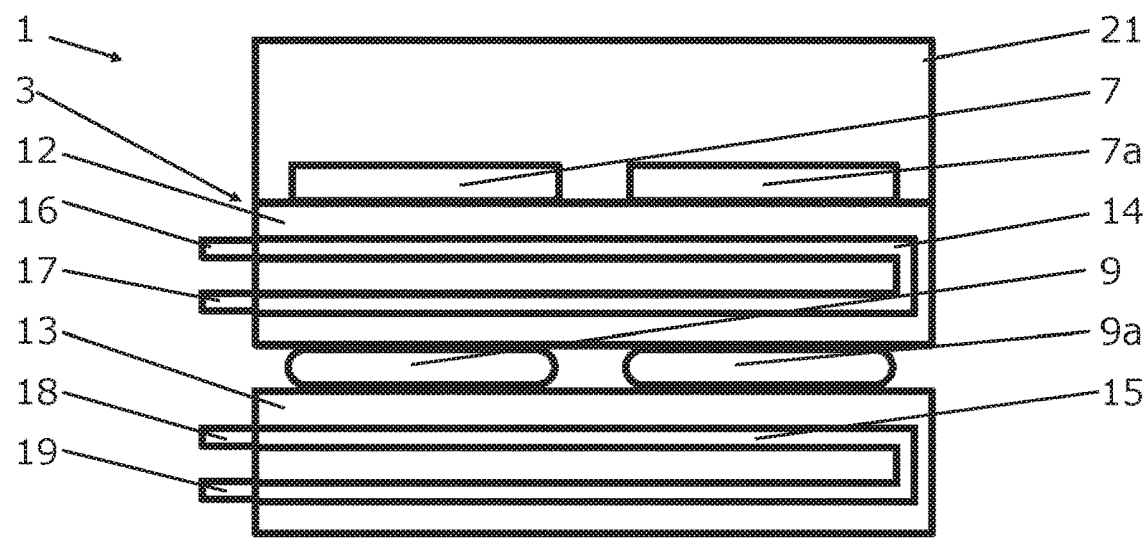
FIG. 6 shows a simplified schematic diagram of a power electronic device according to the invention comprising two intermediate elements, wherein two heating devices are provided between the intermediate elements.

A simplified schematic diagram of a power electronic device 1 according to the invention is shown in FIG. 6, wherein a first intermediate element 12 and a second intermediate element 13 are arranged spaced apart from one another, wherein a first heating device 9 and a second heating device 9a are arranged between the first intermediate element 12 and the second intermediate element 13. Only the first housing section 21 is illustrated in this illustration for the sake of clarity, whereby a corresponding second housing section 22 can be provided.

The first intermediate element 12 has a first fluid inlet 16 and a first fluid outlet 17, wherein the second intermediate element 13 has a second fluid inlet 18 and a second fluid outlet 19. The first intermediate element 12 has a first fluid duct 14, which is fluidically connected to the first fluid inlet 16 and the first fluid outlet 17. The second intermediate element 13 has a second fluid duct 15, which is fluidically connected to the second fluid inlet 18 and the second fluid outlet 19.

A first power electronic unit 7 and a second power electronic unit 7a are arranged on a surface side of the first intermediate element 12, wherein a first heating device 9 and a second heating device 9a are arranged on an opposite surface side of the first intermediate element 12. The first heating device 9 and the second heating device 9a are additionally arranged on a surface side of the second intermediate element 13. The first power electronic unit 7 and the second power electronic unit 7a can be arranged at a distance from one another. The first heating device 9 and the second heating device 9a can be arranged at a distance from one another.

Figure 7:
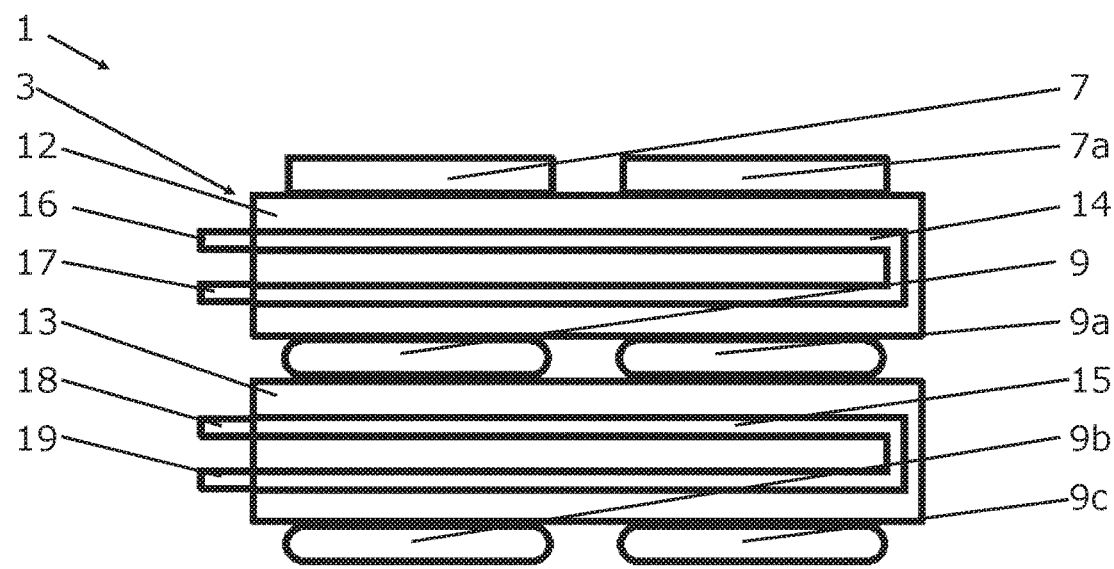
FIG. 7 shows a simplified schematic diagram of a further embodiment of a power electronic device according to the invention comprising two intermediate elements.

Compared to FIG. 6, a third heating device 9b and a fourth heating device 9c are arranged in FIG. 7 on a surface side of the second intermediate element 13, which is located opposite the surface side of the second intermediate element 13, on which the first heating device 9 and the second heating device 9a are arranged.

Figure 8:
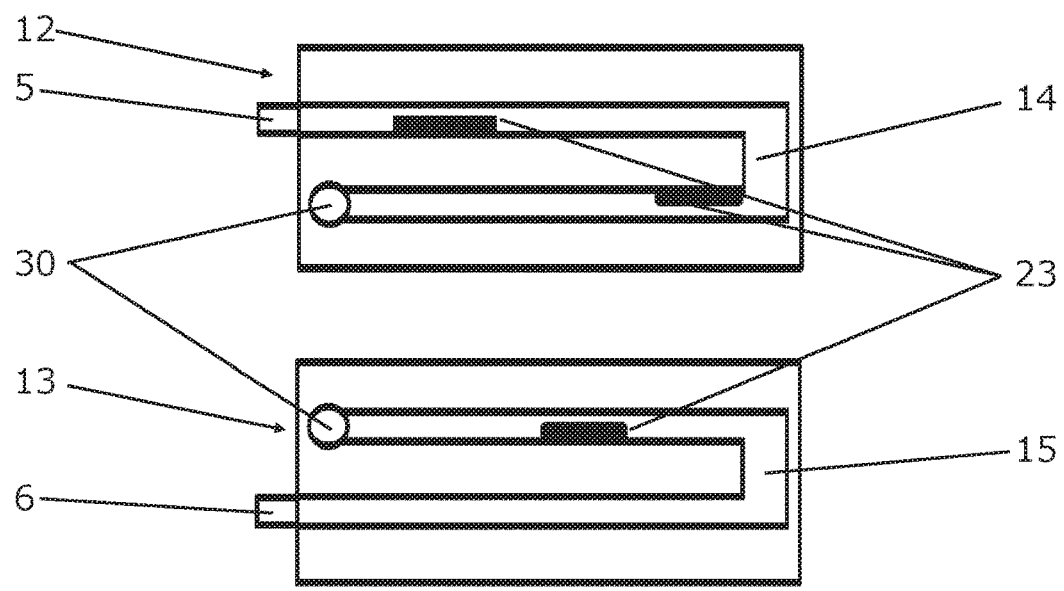
FIG. 8 shows a top view onto a first and a second intermediate element.

A schematic diagram of a top view onto a first intermediate element 12 and a second intermediate element 13 is shown in FIG. 8, wherein, for the sake of clarity, the two elements are illustrated offset to one another. The first intermediate element 12 has a first fluid duct 14, which has a U-shaped path. The second intermediate element 13 has a second fluid duct 15, which has a U-shaped path. The first fluid duct 14 and the second fluid duct 15 have turbulence inserts 23, which can generate turbulent fluid flows. The first fluid duct 14 and the second fluid duct 15 can further be connected via a connecting duct 30 in such a way that a fluid inside the fluid ducts has an essentially identical flow direction.

Figure 9:
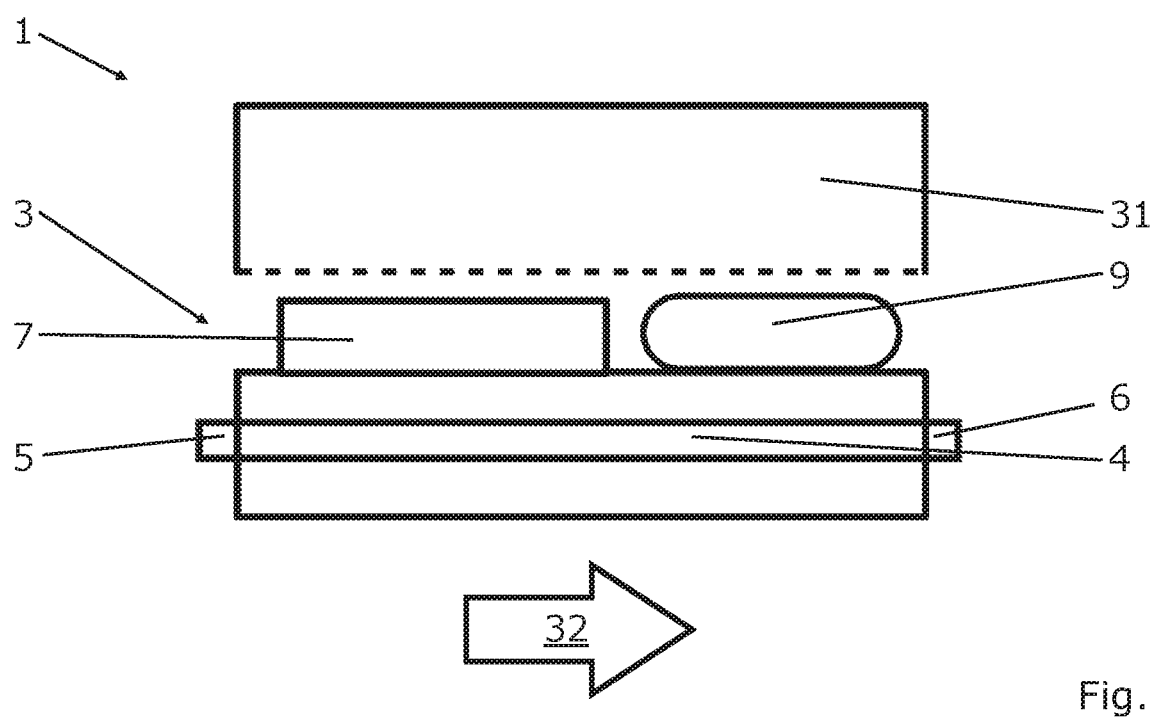
FIG. 9 shows a simplified schematic diagram of a further embodiment of a power electronic device according to the invention.

A simplified schematic diagram of a power electronic device 1 according to the invention is shown in FIG. 9, wherein a flow direction 32 of a fluid is illustrated, which flows through a fluid duct system 4 of an intermediate element 3 from a fluid inlet 5 to a fluid outlet 6. The intermediate element 3 forms a housing wall, in particular a housing bottom, of a housing 31. A power electronic unit 7 and the heating device 9 are arranged on the intermediate unit 3 in series or along the flow direction 32, respectively, spaced apart from one another.

The invention claimed is:

1. A power electronic device for a vehicle, comprising:
a first housing section and a second housing section,
at least one intermediate unit having at least one fluid duct system that is fluidically connected to a fluid inlet and a fluid outlet,
at least one power electronic unit arranged at least at a surface of the at least one intermediate unit,
at least one heating device arranged at least at a surface of the at least one intermediate unit,
wherein the at least one heating device is connected to the at least one power electronic unit in an electrically conductive manner, and the at least one heating device is supplied with electrical power or electrical energy via the at least one power electronic unit,
the at least one power electronic unit arranged between the at least one intermediate unit and the first housing section,
the at least one heating device arranged between the at least one intermediate unit and the second housing section, and
wherein a subregion of the first housing section abuts on a first side of the at least one intermediate unit, and a subregion of the second housing section abuts on a second side of the at least one intermediate unit.

2. The power electronic device according to claim 1, wherein the at least one heating device is arranged downstream from the at least one power electronic unit with respect to a fluid flow direction through the at least one fluid duct system.

3. The power electronic device according to claim 1, wherein the at least one heating device and the at least one power electronic unit are arranged on different surface sides of the at least one intermediate unit.

4. The power electronic device according to claim 1, wherein:
the at least one intermediate unit includes at least a first intermediate element and a second intermediate element,
wherein the first intermediate element has at least a first fluid duct,
wherein the second intermediate element has at least a second fluid duct, and
wherein the first fluid duct and the second fluid duct provide the at least one fluid duct system.

5. The power electronic device according to claim 4, wherein:
the first intermediate element has a first fluid inlet and a first fluid outlet, the first fluid inlet and the first fluid outlet fluidically connected to the first fluid duct, and
the second intermediate element has a second fluid inlet and a second fluid outlet, the second fluid inlet and the second fluid outlet fluidically connected to the second fluid duct.

6. The power electronic device according to claim 4, wherein the first fluid duct and the second fluid duct are fluidically connected to one another.

7. The power electronic device according to claim 4, wherein the first intermediate element is at least partially arranged at the second intermediate element.

8. The power electronic device according to claim 4, wherein the first intermediate element and the second intermediate element are at least partially connected to one another via a substance-to-substance bond.

9. The power electronic device according to claim 4, wherein the first intermediate element and the second intermediate element are at least partially connected to one another via an additional layer.

10. The power electronic device according to claim 4, wherein one of:
the first fluid duct is configured to be essentially straight, and the second fluid duct is configured to be essentially straight; and
the first fluid duct is configured to be essentially U-shaped, and the second fluid duct is configured to be essentially U-shaped.

11. The power electronic device according to claim 4, wherein the at least one heating device is arranged between the first intermediate element and the second intermediate element.

12. The power electronic device according to claim 1, the at least one fluid duct system includes turbulence inserts.

13. The power electronic device according to claim 1, wherein at least one of the at least one power electronic unit and the at least one heating device are attached to a surface of the at least one intermediate unit via a substance-to-substance bond.

14. The power electronic device according to claim 1, the at least one intermediate unit defines at least one of a housing wall of a housing and a housing section of the at least one power electronic device.

15. The power electronic device according to claim 1, wherein the at least one fluid duct system is configured to be at least one of essentially straight at least in some sections and essentially U-shaped at least in some sections.

16. The power electronic device according to claim 1, wherein the at least one power electronic unit and the at least one heating device are arranged in series at the at least one intermediate unit with respect to a fluid flow direction through the at least one fluid duct system.

17. The power electronic device according to claim 1, wherein the at least one intermediate unit has at least one of at least one intermediate element and at least one cooling element.

18. The power electronic device according to claim 1, wherein the at least one heating device comprises at least one of a resistance heating element, a thick film heating element, and a PTC element.

19. A power electronic device for a vehicle, comprising: a power electronic device, the power electronic device including:
- at least one intermediate unit having at least one fluid duct system that is fluidically connected to a fluid inlet and a fluid outlet,
- at least one power electronic unit arranged at least at a surface of the at least one intermediate unit,
- at least one heating device arranged at least at a surface of the at least one intermediate unit,
- a first housing section and a second housing section,
- wherein the at least one heating device is connected to the at least one power electronic unit in an electrically conductive manner, and the at least one heating device is supplied with electrical power or electrical energy via the at least one power electronic unit,
- wherein the at least one power electronic unit is arranged between the at least one intermediate unit and the first housing section, and the at least one heating device is arranged between the at least one intermediate unit and the second housing section, and
- wherein a subregion of the first housing section abuts on a first side of the at least one intermediate unit, and a subregion of the second housing section abuts on a second side of the at least one intermediate unit.

20. The vehicle according to claim 19, wherein the at least one heating device comprises at least one of a resistance heating element, a thick film heating element, and a PTC element.

* * * * *